United States Patent [19]
Williams et al.

[11] Patent Number: 5,556,808
[45] Date of Patent: Sep. 17, 1996

[54] METHOD FOR ALIGNING A SEMICONDUCTOR DEVICE

[75] Inventors: William M. Williams, Gilbert; Barbara Vasquez; Marlene J. Begay, both of Chandler; Patrick Thompson, Gilbert, all of Ariz.

[73] Assignee: Motorola Inc., Schaumburg, Ill.

[21] Appl. No.: 268,986

[22] Filed: Jun. 30, 1994

[51] Int. Cl.⁶ .................................................. H01L 21/60
[52] U.S. Cl. ........................... 437/209; 437/211; 437/214; 437/217; 437/218
[58] Field of Search ...................... 437/209, 211, 437/214, 215, 216, 217, 218, 219, 220, 924; 257/777, 797, 676

[56] References Cited

U.S. PATENT DOCUMENTS

| | | | |
|---|---|---|---|
| 5,150,193 | 9/1992 | Yasuhara et al. | 257/676 |
| 5,260,599 | 11/1993 | Ponse et al. | 257/797 |
| 5,283,205 | 2/1994 | Sakamoto | 437/924 |
| 5,360,761 | 11/1994 | Andrews | 437/924 |
| 5,381,047 | 1/1995 | Kanno | 257/777 |
| 5,408,131 | 4/1995 | Khatri et al. | 257/797 |
| 5,475,775 | 12/1995 | Kragl et al. | 437/211 |

FOREIGN PATENT DOCUMENTS

| | | | |
|---|---|---|---|
| 62-24259 | 2/1987 | Japan | 437/924 |
| 4133349 | 5/1992 | Japan | 257/797 |
| 4186759 | 7/1992 | Japan | 257/797 |
| 5304070 | 11/1993 | Japan | 437/924 |

*Primary Examiner*—Kevin M. Picardar
*Attorney, Agent, or Firm*—Aaron B. Bernstein; George C. Chen

[57] ABSTRACT

A system and method for aligning a semiconductor device (10) to a fixture (11) is provided. A first physical alignment feature (12) on the semiconductor device (10) and a second physical alignment (24) on the fixture (11) mate to align and hold the semiconductor device (10) in place. In one embodiment the physical alignment features (12) and (24) are produced using standard photolithography techniques, resulting in precise alignment features. In another embodiment the physical alignment features (12) and (24) are designed and placed to control the direction the thermal expansion of the semiconductor device (10) relative to the fixture (11).

41 Claims, 10 Drawing Sheets

FIG. 12
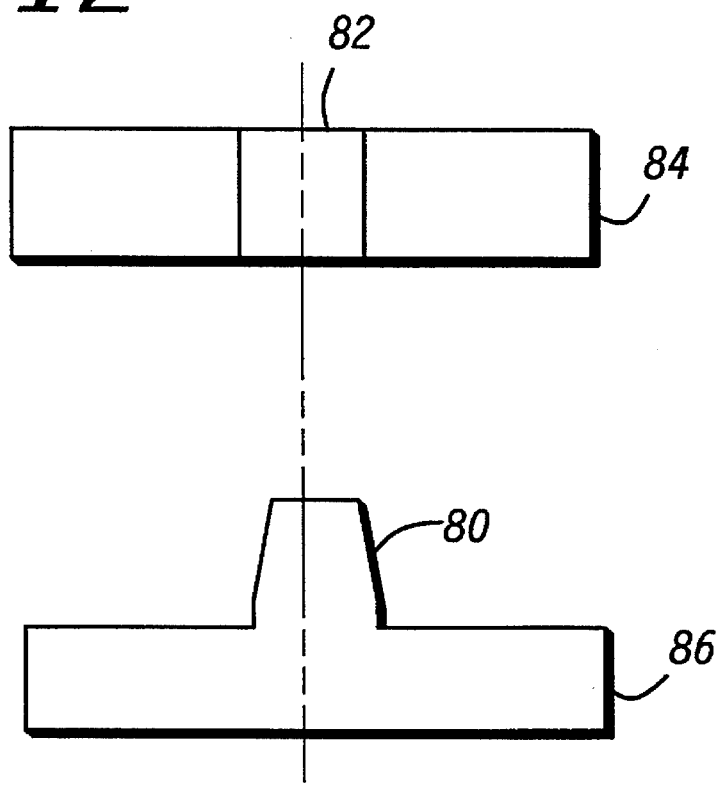
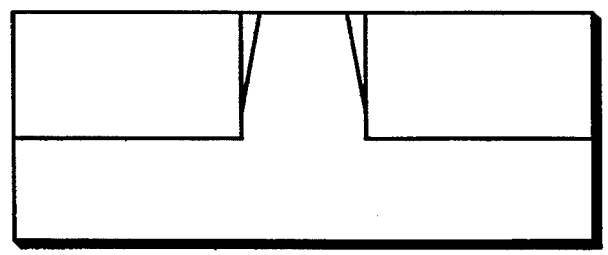
FIG. 13

FIG. 14
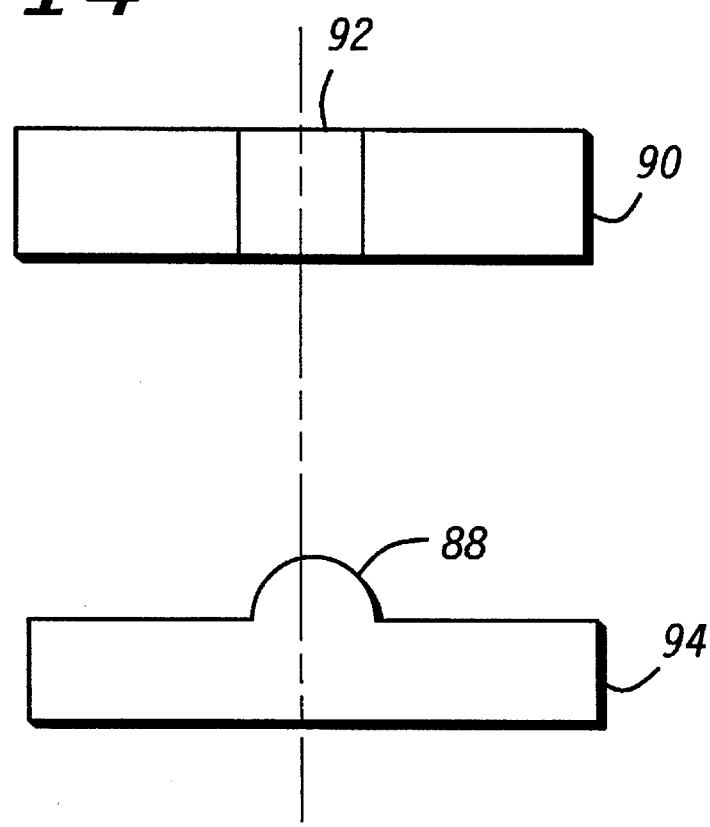
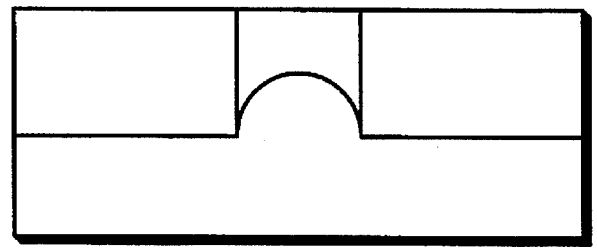
FIG. 15

METHOD FOR ALIGNING A SEMICONDUCTOR DEVICE

FIELD OF THE INVENTION

The present invention relates, in general, to locating semiconductor devices, and more particularly, to aligning semiconductor dies and wafers.

BACKGROUND OF THE INVENTION

During the production of semiconductor devices it is often necessary to precisely locate and align the semiconductor components so that they can be tested, burned-in and/or permanently attached in the correct spot. For example, semiconductor devices often have many, closely spaced electrical contacts which may be in the form of pads, conductive bumps, or the like. If the device is to be electrically tested, or stressed (burned-in), the device must be precisely aligned to a test fixture or test probe so that the contacts on the device match up with the contacts on the fixture or probe. For the same reasons, the semiconductor device must be precisely aligned during final assembly into a package.

Conventionally alignment has been accomplished with vision guided placement systems. These vision guided placement systems use cameras to capture digital pictures of the semiconductor devices and, in some cases, the substrate to which the semiconductor device is to be mated. A computerized system then compares, matches and aligns the semiconductor device to the substrate. These vision guided placement systems have the disadvantage of being costly and relatively slow. Also, they do not provide any way of keeping the semiconductor component aligned once it is in place. Consequently, any later movement can create misalignment.

An additional method of aligning a semiconductor component involves physically constraining the outside edges of the component by placing the component between raised perimeter edges sized larger than the component, either randomly within the opening of the raised perimeter edges or forced into a chosen corner with springs. FIG. 1A shows a semiconductor component 2 randomly placed in a fixture 4. This method relies on the edges of the fixture 4 for aligning the semiconductor device 2. These edges are usually formed by cutting, casting or molding techniques, making it difficult and expensive to precisely align a semiconductor component with this method.

Referring now to FIG. 1B, in order to partially overcome these limitations a spring 5 is sometimes used to force the semiconductor component 6 into a desired corner of the semiconductor fixture 8. This is an improvement over randomly placing the semiconductor component in the fixture. However, the dimensions of the semiconductor device 6 and the fixture 8 must still be extremely precise in order to achieve precise alignment of the semiconductor component with this method.

An alternate approach uses three point edges 9 to align a semiconductor component when pushed into the desired corner by the spring. See FIG. 1C. This method also relies on the precision of the dimensions of the device and the fixture features 9, in order to achieve precise alignment. Again, because these edges are made using standard forming techniques it is difficult to achieve a precise alignment.

Consequently it is desirable to have a method that precisely aligns a semiconductor component which does not require a slow and expensive visual guided placement system or require precise edges on the semiconductor component and fixture or other aligning surface.

BRIEF DESCRIPTION OF THE DRAWINGS

FIG. 12 is a cross sectional side view representing a tapered alignment protrusion and cavity;

FIG. 13 is a cross sectional side view representing a mated alignment protrusion and cavity;

FIG. 14 is a cross sectional side view representing a semi-spherical alignment protrusion and cavity; and FIG. 15 is a cross sectional side view representing a mated alignment protrusion and cavity.

DETAILED DESCRIPTION OF THE DRAWINGS

According to one embodiment of the present invention an alignment method is provided for aligning a semiconductor device, such as a semiconductor die, to an external fixture. The semiconductor device is aligned to the external fixture with a pair of physical alignment features. The alignment features control the relative location of component and substrate in x, y and theta. In one embodiment the first physical alignment feature is precisely formed on the semiconductor device using standard photolithography techniques. The second physical alignment feature, corresponding to the first physical alignment feature, is formed on the external fixture. By mating the first and second physical alignment features the precise placement and alignment of the semiconductor device with the external fixture is accomplished. While mated, the walls of the first and second alignment features bind the semiconductor device in place and maintain alignment during any testing or assembly procedures.

In another embodiment in accordance with the present invention, a method is provided for controlling the direction of the thermal expansion of the semiconductor device. A first alignment feature is placed at the desired center of thermal expansion of the semiconductor device. Additional alignment features are provided with corresponding slots. The slots allow for thermal expansion in a direction away from the first alignment feature while maintaining precise placement and alignment based on the position of the first alignment feature.

Another embodiment in accordance with the present invention incorporates holes or slots, formed either partially or totally through the semiconductor device. The corresponding feature is a round post or a cone or hemisphere which engages the holes or slots. It will be recognized that a variety of shapes may be used, such as squares, rectangles or triangles which align and position the semiconductor device with an external interconnect fixture.

The alignment features can be formed on the semiconductor device using standard photolithography techniques. For example, cavities are formed by etching away the cavity, and protrusions are formed by etching down around the protrusion. A protrusion may also be created by plating up through a patterned sacrificial mask layer. These and other known semiconductor processing techniques can be used to precisely form alignment features on or in the semiconductor device. Because of the precision of the features formed using these processing techniques, alignment precision is greatly enhanced compared to conventional edge based alignment.

Figure 1A:
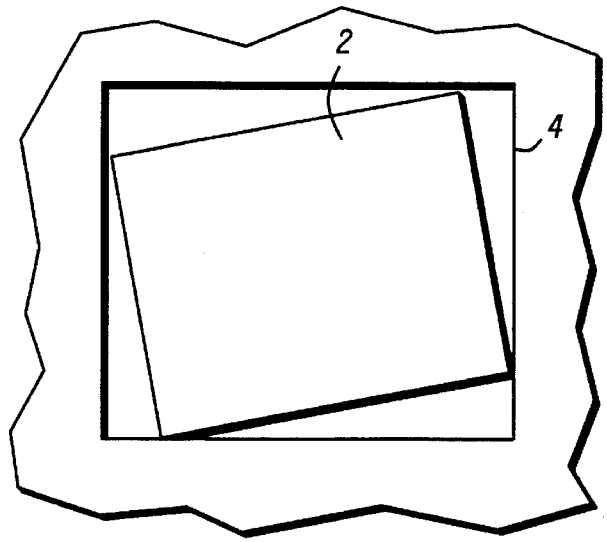
FIGS. 1A–1C are top views illustrating prior art approaches for aligning semiconductor devices.
Figure 1B:
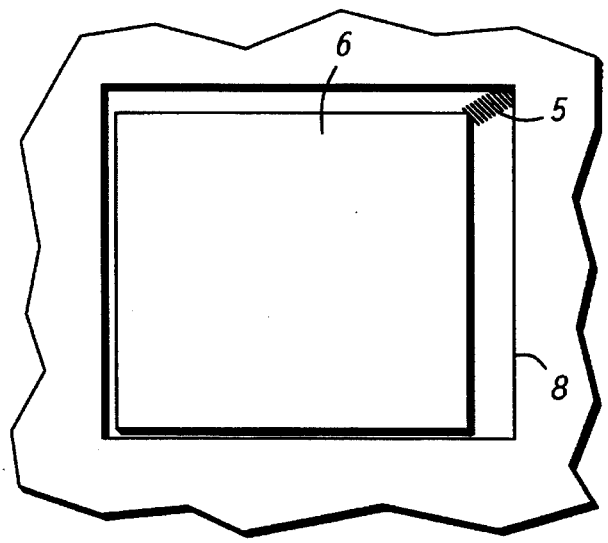
Figure 1C:
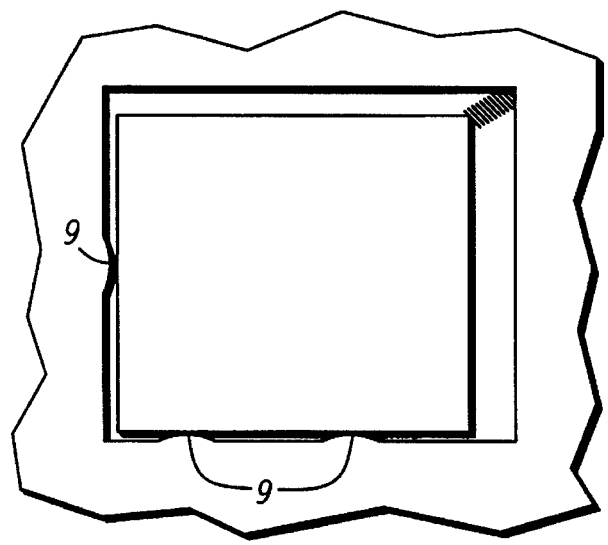
Figure 2:
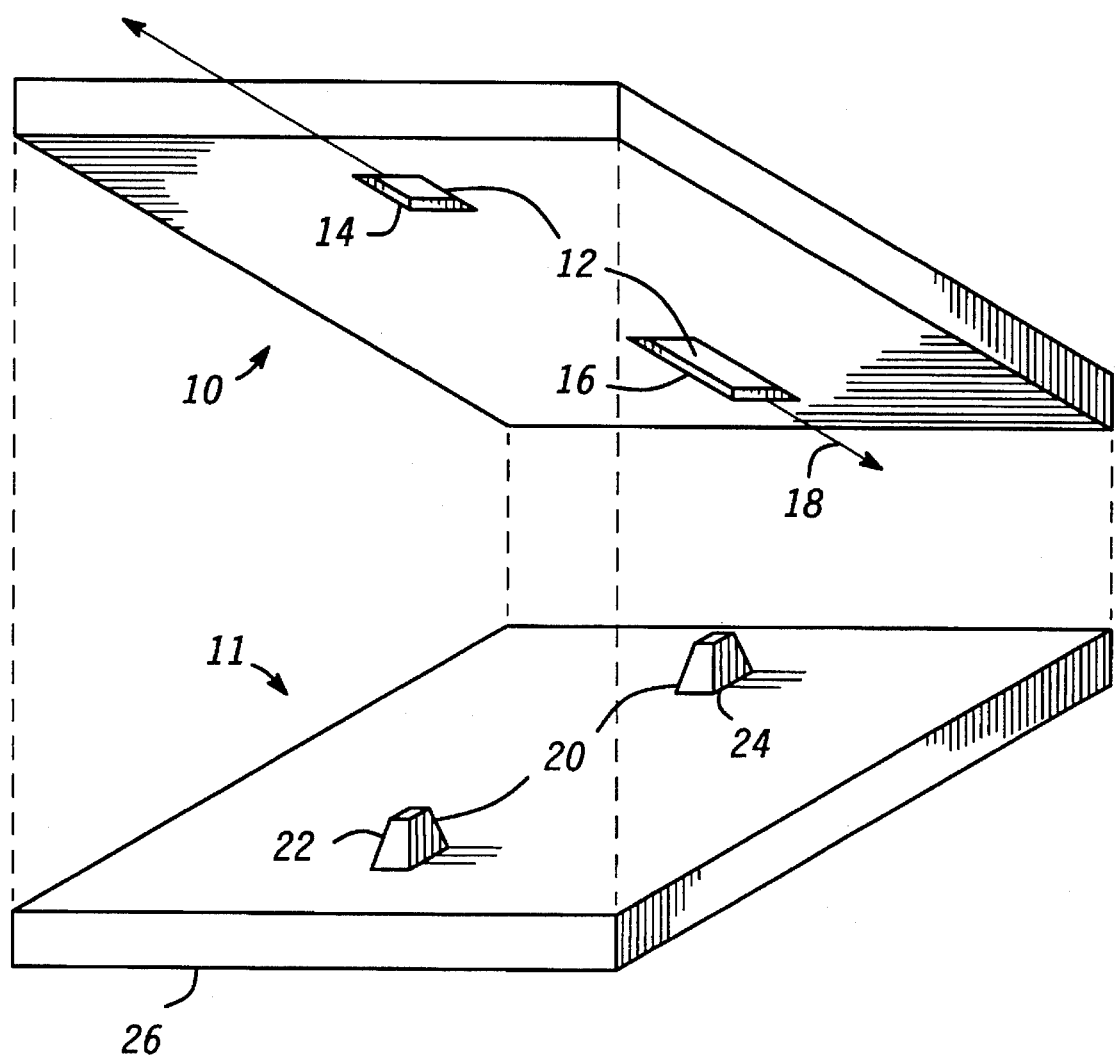
FIG. 2 is an isometric view illustrating an alignment method.

Turning now to the figures for a more detailed description of the preferred embodiment of the present invention, FIG. 2 is an isometric view representing a method for aligning a semiconductor device. FIG. 2 shows a semiconductor device 10. The semiconductor device 10 has a first physical alignment feature 12. In one embodiment, the first physical alignment feature 12 consists of an alignment cavity 14 and a slot 16 having a longitudinal axis. To control relative location and direction of thermal expansion the alignment cavity 14 is placed at a desired center of thermal expansion. The slot 16 is placed with its longitudinal axis lying on an axis 18 extending from the alignment cavity 14 in a direction of desired thermal expansion. This is especially important where the semiconductor device 10 and fixture 11 have different coefficients of thermal expansion.

A second physical alignment feature 20 is also provided on fixture 11 comprising substrate 26. It should be understood that the word "substrate", as used in this disclosure, for example with reference to substrate 26, is intended to be taken in the broadest sense, and includes but is not limited to anything providing a surface to which a semiconductor device, or the like, is to be aligned. Still referring to FIG. 2, the second physical alignment feature 20 comprises a first tapered alignment protrusion 22 and at least one additional tapered alignment protrusion 24. First tapered alignment protrusion 22 is placed corresponding to the alignment cavity 14. The additional tapered alignment protrusion 24 is placed in a position corresponding to a slot having longitudinal axis 18. The tapered alignment protrusions 22 and 24 are placed such that mating between the semiconductor device 10 and the substrate 26 provides for precise alignment of the semiconductor device 10 in a desired position. Because the alignment cavity 14 is placed at the desired center of thermal expansion it will remain precisely placed even when the semiconductor device 10 has expanded or contracted relative to the substrate due to heating or cooling.

It should be noted that in the preferred embodiment, the relative height of the protrusions and the associated cavity depth are such that the surfaces of the semiconductor device and substrate are not prevented from contacting each other. Also, the alignment features could also be placed at the edge of the semiconductor device 10, or any place on the device where it is convenient.

Figure 3:
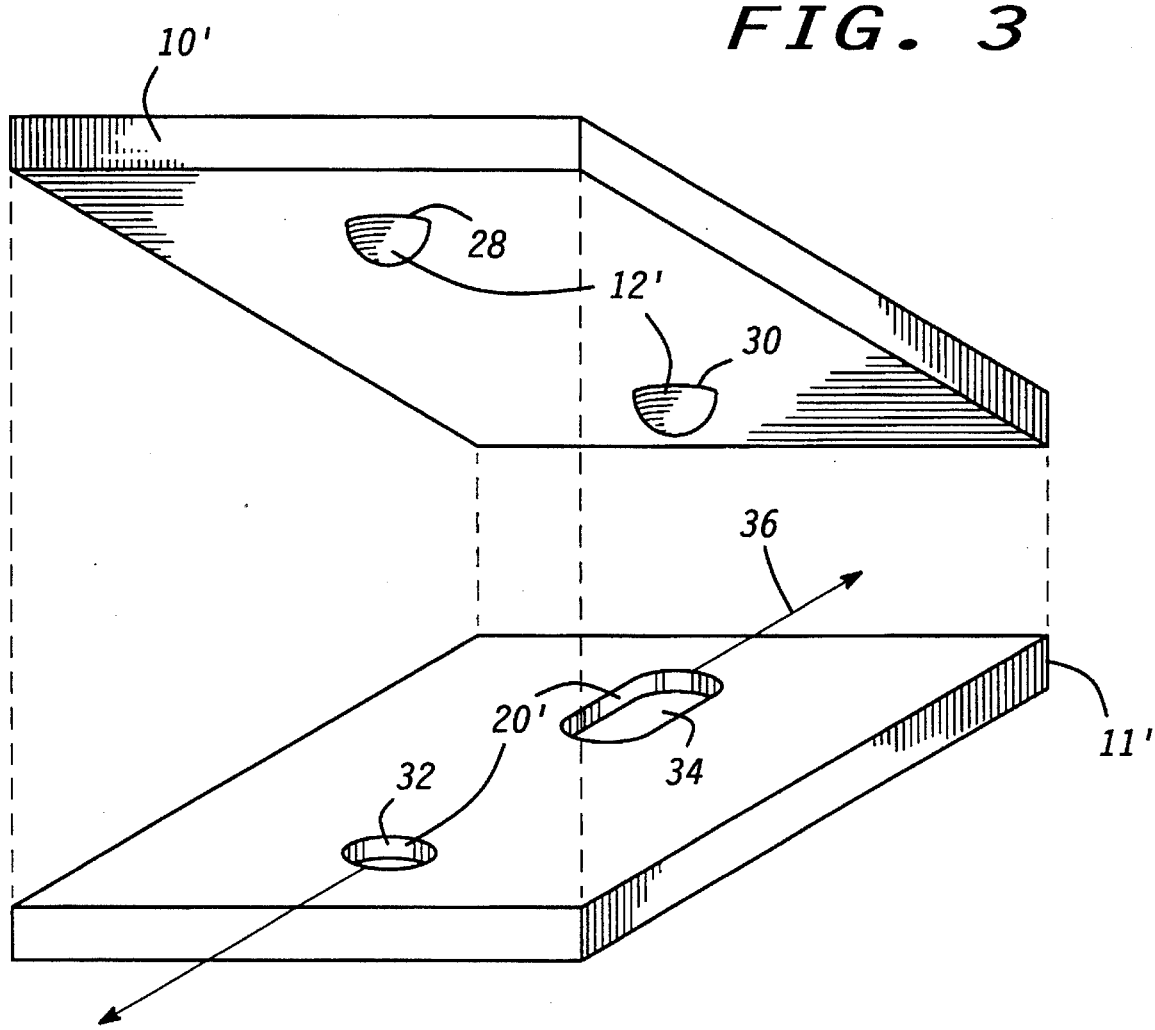
FIG. 3 is an isometric view illustrating an alignment method.

Turning to FIG. 3, FIG. 3 is an isometric view representing a method of aligning a semiconductor device according to the present invention. In this embodiment semiconductor device 10' has a first physical alignment feature 12' comprising a first semi-spherical alignment protrusion 28 and a second semi-spherical alignment protrusion 30. The first semi-spherical alignment protrusion 28 is located by design at the desired center of thermal expansion. Fixture 11' has a second physical alignment feature 20' comprising a first alignment cavity 32 and a slot 34 having a longitudinal axis. The first alignment cavity 32 is placed in a position corresponding to the first semi-spherical alignment protrusion 28. The slot 34 is placed with its longitudinal axis on an axis 36 extending from the first alignment cavity in the direction of desired thermal expansion.

The semi-spherical alignment protrusions 28 and 30 of this embodiment are made using standard photolithography techniques including plating and etching. These methods provide precise feature size tolerances and precise alignment.

Figure 4:
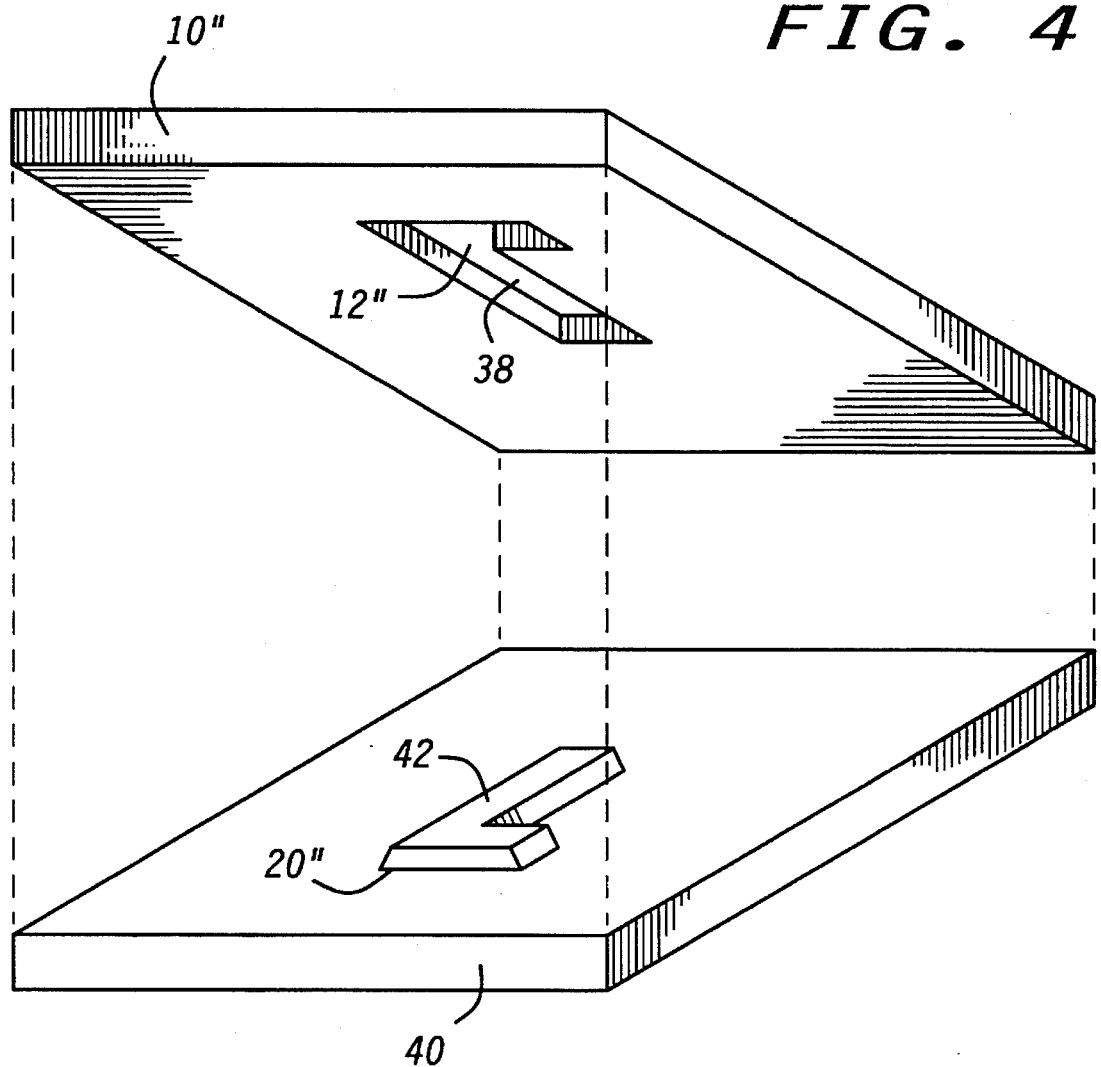
FIG. 4 is an isometric view illustrating an alignment method.

Turning to FIG. 4, FIG. 4 is an isometric view representing a system for aligning a semiconductor device. Semiconductor device 10" includes a first physical alignment feature 12". In one embodiment the first physical alignment feature 12 comprises a cavity having at least two sides meeting to form an angle between them. In the present embodiment, the first physical alignment feature 12" comprises a L-shaped cavity 38. The L-shaped cavity has six sides that meet to form six angles between the sides. The longer the length of these sides the better the alignment for a given feature tolerance. The L-shaped cavity 38 is made by etching the semiconductor device 10", creating a precise alignment feature.

A substrate 40 is also provided having a second physical alignment feature 20". Again, in one embodiment the physical alignment feature has two sides that come together to form an angle. In this embodiment the second physical alignment feature 20" comprises an L-shaped protrusion 42. The L-shaped protrusion has six sides that meet to form six angles between the sides. Using alignment features with at least two sides that come together at an angle allows the semiconductor device to be aligned for position as well as rotation with one protrusion and cavity. In contrast, some of the previously discussed embodiments utilize two or more protrusions and corresponding cavities in order to constrain the device in two directions and prevent angular movement.

Preferably, the L-shaped protrusion 42 is formed by plating up the protrusion on the substrate 40 using standard lithography techniques. The protrusion 42 could also be formed by patterning and etching the substrate material away, leaving the raised protrusion 42. Thus, the semiconductor device 10" can be precisely aligned to the substrate 40 through the use of the L-shaped cavity 38 and the L-shaped protrusion 42.

Figure 5:
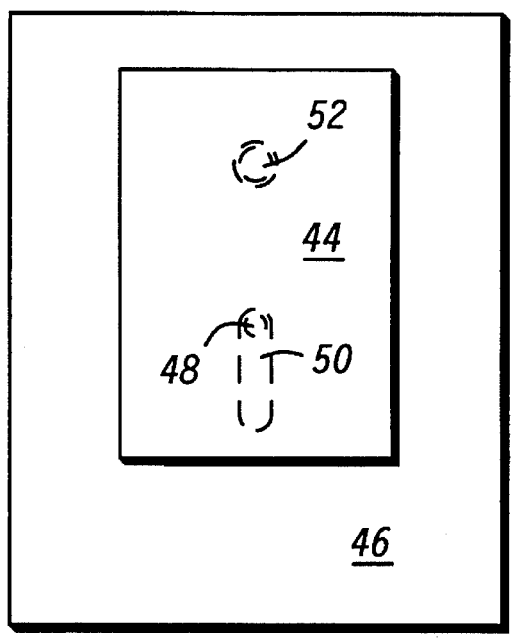
FIG. 5 is a top view illustrating an alignment method.
Figure 6:
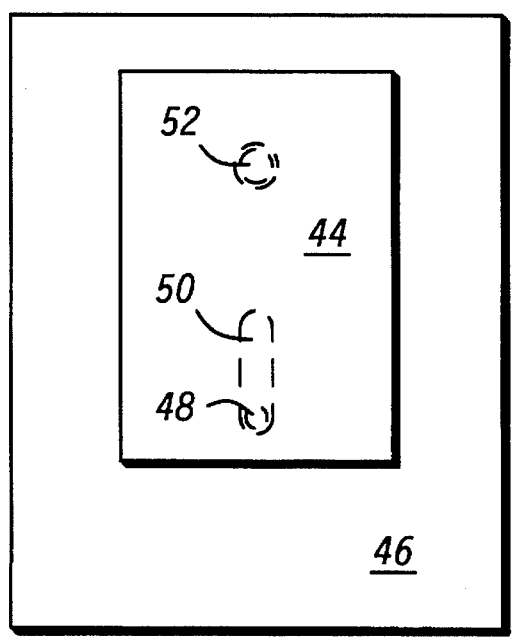
FIG. 6 is a top view illustrating an alignment method.

Turning to FIG. 5, FIG. 5 is a top view representing an alignment method with a semiconductor device and substrate with different coefficients of thermal expansion. A semiconductor device 44 is aligned with substrate 46, according to an embodiment of the present invention similar to that of FIG. 3. When the semiconductor device 44 and substrate 46 are at room temperature the alignment protrusion 48 on the semiconductor device 44 will be near the innermost edge of the slot 50 by design. Turning now to FIG. 6, FIG. 6 is a top view representing an alignment method when a semiconductor device 44 has a higher coefficient of thermal expansion and the semiconductor device 44 and substrate 46 are heated. When semiconductor device 44 and substrate 46 are heated the alignment protrusion 48 will move toward the outermost portion of the alignment slot 50 due to the expansion of the semiconductor device 44 relative to the substrate 46. The position of the alignment slot and the first protrusion 52 establishes the center of the expansion. While the semiconductor device 44 expands relative to substrate 46 when heated, its position at 52 will be unchanged. Therefore, using this method the direction of the expansion can be controlled and a precise alignment based on the position at 52 can be obtained regardless of the temperature of the semiconductor device 44 or substrate/fixture 46.

The relative location of the cavities and protrusions on a semiconductor device and substrate would be designed to accommodate the coefficients of thermal expansion of materials of the device and substrate and the temperature range of interest for test burn-in and/or assembly.

Figure 7:
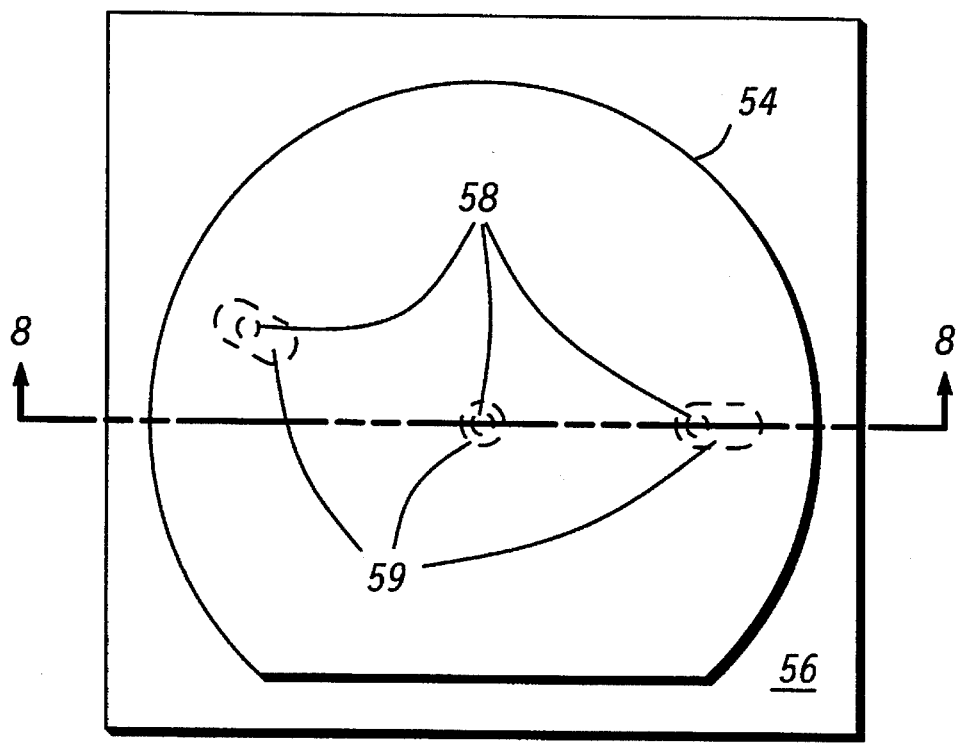
FIG. 7 is a top view illustrating an alignment method.

Turning now to FIG. 7, FIG. 7 is a top view representing a method of aligning a semiconductor wafer. In this embodiment a first physical alignment feature 58 on the semiconductor wafer 54 and a second physical alignment feature 59 on the substrate 56 are used to align a semiconductor wafer 54 with a substrate 56. The pair of alignment features can again comprise slots and protrusions to allow for controlling the direction of thermal expansion during heating or cooling of the semiconductor wafer. Thus the entire semiconductor wafer 48 can be heated or cooled for testing while still being aligned to the substrate 56.

Figure 8:
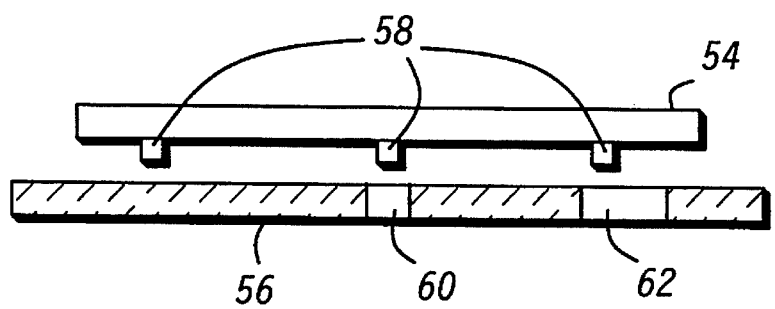
FIG. 8 is a cross sectional side view taken along line 8—8 in FIG. 7.

Turning to FIG. 8, FIG. 8 is a cross sectional side view representing a method for aligning a semiconductor wafer and a substrate taken along line 8—8 in FIG. 7. In this embodiment, the semiconductor wafer 54 has protrusions 58 as a first alignment feature. The substrate 56 has an alignment cavity 60 and an alignment slot 62. In this way the entire semiconductor wafer is aligned to the substrate 56 according to the positions of the slots, cavities and alignment protrusions.

Figure 9:
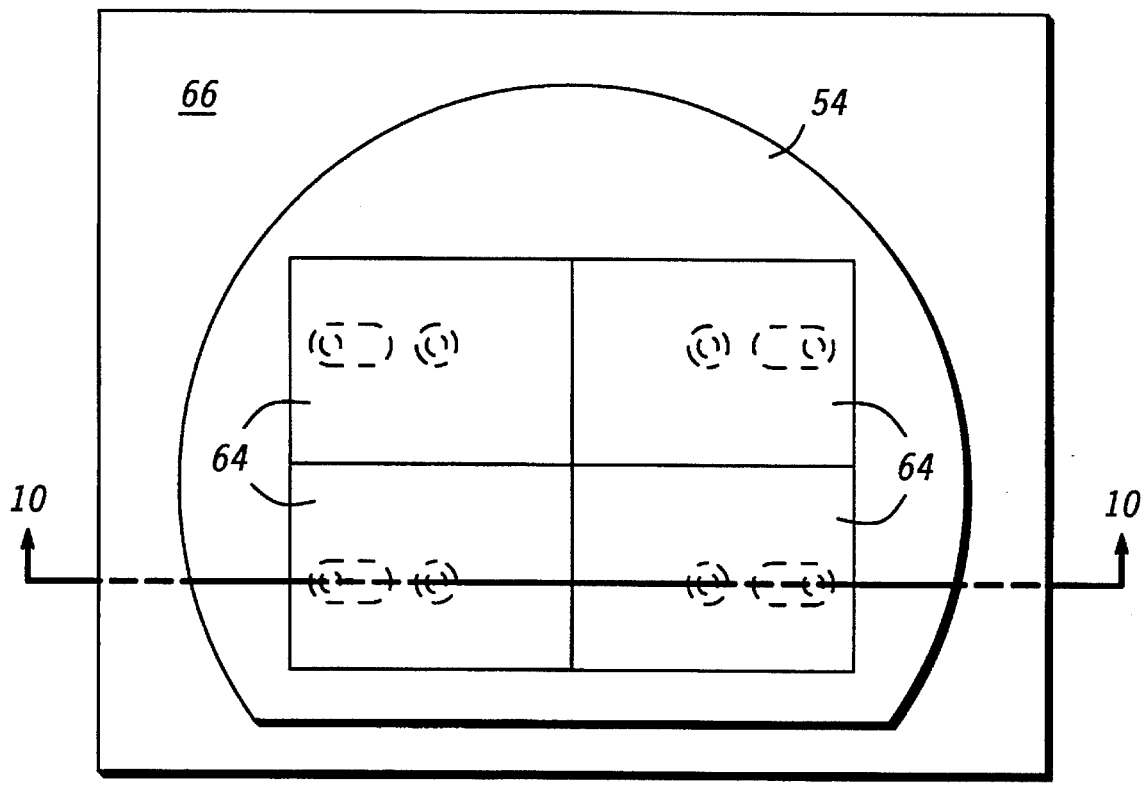
FIG. 9 is a top view illustrating an alignment method.

Turning to FIG. 9, FIG. 9 is a top view representing a method of aligning a semiconductor wafer and substrate. In this embodiment, each semiconductor die 64 on the wafer has its own set of first and second alignment features. Therefore each individual die 64 on the semiconductor wafer 54 is aligned to a precise position relative to substrate 66. The repeating pattern makes the photolithographic definition of the features on the wafer compatible with steppers used in high volume, VLSI manufacturing. Again, the first and second alignment features comprise slots, cavities and protrusions to control the direction of thermal expansion relative to substrate 66.

Figure 10:
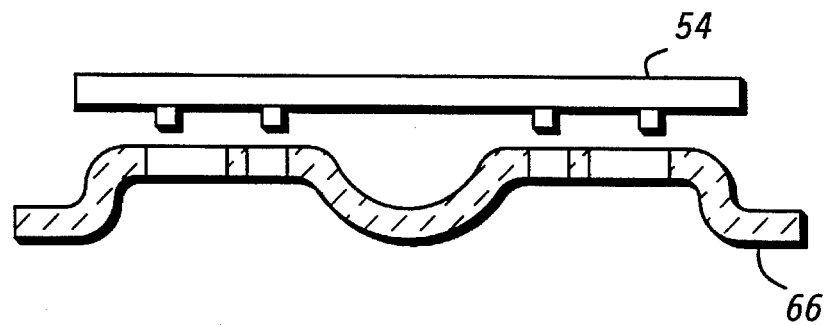
FIG. 10 is a cross sectional side view taken along line 10—10 in FIG. 9.

Turning now to FIG. 10, FIG. 10 is a cross section of FIG. 9 taken along line 10—10. The substrate 66 of FIG. 10 comprises a flexible substrate. This flexible substrate has a set of alignment features for each semiconductor die 64 (not shown in this figure). The flexible substrate 66 allows the individual sets of alignment features on the substrate 66 to move independently. Therefore, each individual die 64 is aligned independently to a portion of the substrate 66.

Figure 11:
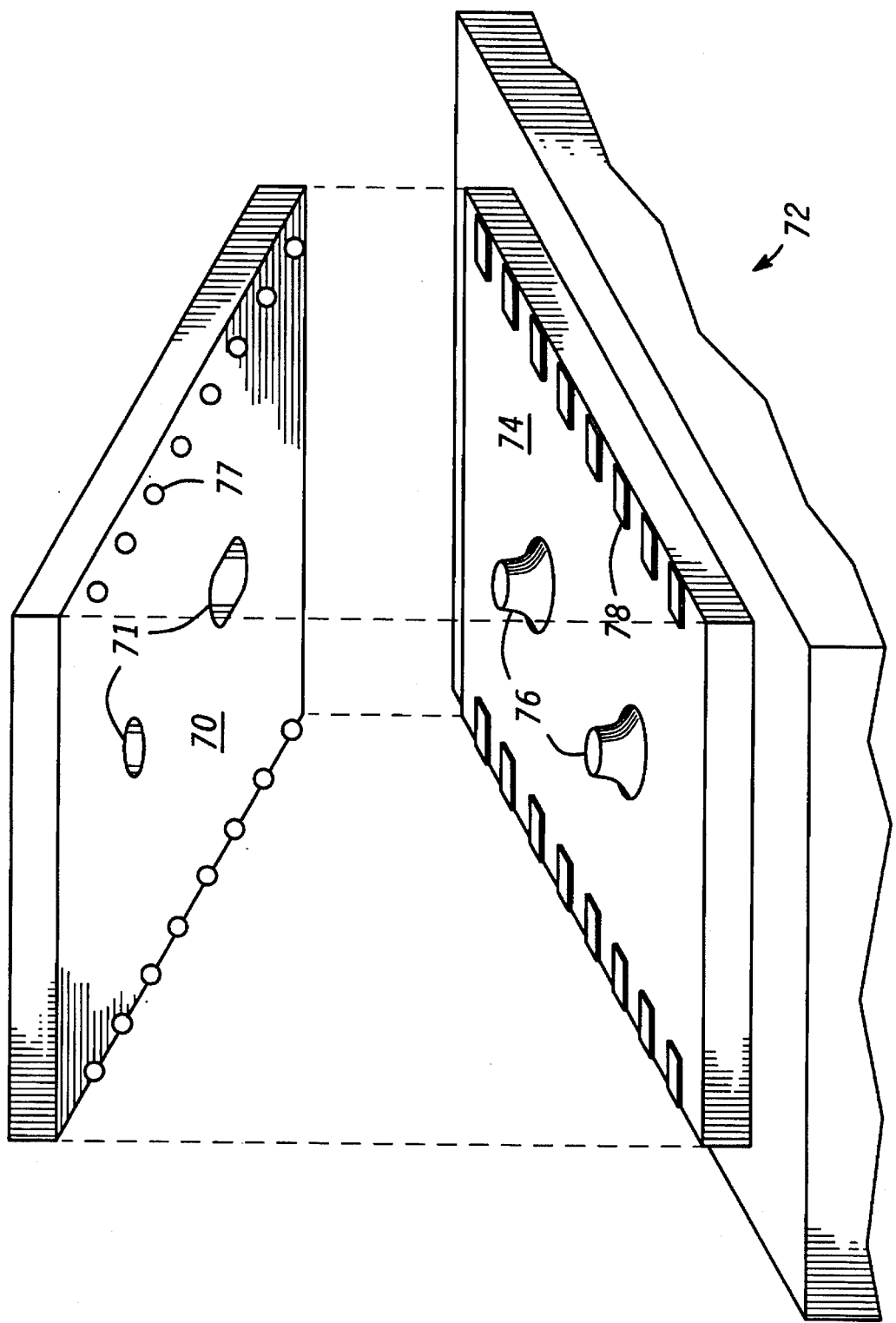
FIG. 11 is a perspective view illustrating an alignment method.

Turning to FIG. 11, FIG. 11 is a perspective view representing a method for aligning a semiconductor device for testing. The semiconductor device 70 again has a first physical alignment feature 71. A test fixture 72 is also provided. The test fixture 72 has a test substrate 74 with a corresponding set of physical alignment features 76. The first and second sets of physical alignment features serve to align the semiconductor device 70 such that the contacts 77 of semiconductor device 70 are aligned with and contact the leads 78 of the test fixture. Thus the semiconductor device 70 can be dropped on to the test fixture 72 and the leads 78 of the test fixture will automatically be aligned with and contact the contacts 77 of the semiconductor device 70. The device can then be tested and removed without any permanent alteration to the semiconductor device.

The first physical alignment feature 71 could also be used to locate the position of a specific contact, such as the ground, on the semiconductor device.

Turning now to FIG. 12, FIG. 12 is a side view representing an alignment protrusion 80 and an alignment cavity 82. The alignment protrusion 80 is tapered such that if the device 84 is misaligned with the substrate 86 when initially contacted, the tapered alignment protrusion will automatically align the device 84 with the substrate 86 upon mating of the two devices, as shown in FIG. 13. When mated, the walls of the alignment cavity 82 bind the sides of the alignment protrusion 80 to keep the device 84 aligned with substrate 86.

Turning now to FIG. 14, FIG. 14 is a side view representing an alignment protrusion. The alignment protrusion 88 in this embodiment is a semi-spherical protrusion. A device 90 with a cavity 92 is to be mated to the substrate 94. Again, if the device 90 is misaligned with the substrate 94 the semi-spherical alignment protrusion 88 will automatically align the device 90 and the substrate 94 upon mating, as shown in FIG. 15. Also, the portion of the spherical alignment protrusion 88 near the flat surface of substrate 94 will bind with the alignment cavity 92 when mated to keep the device 90 and substrate 94 aligned.

While the invention has been particularly shown and described with reference to the preferred embodiments, it will be understood by those skilled in the art that the foregoing and other changes in form and details may be made without departing from the spirit and scope of the invention.

We claim:

1. A method for aligning a semiconductor device comprising the steps of:

providing a semiconductor device;

providing a first physical alignment feature at a center of thermal expansion of the semiconductor device;

providing a second physical alignment feature at a location away from the center of thermal expansion of the semiconductor device;

providing a substrate having a third physical alignment feature; and mating the first and second physical alignment features with the third physical alignment feature.

2. The method as in claim 1 wherein the first physical alignment feature comprises at least one alignment cavity and the third physical alignment feature comprises at least one alignment protrusion.

3. The method as in claim 1 wherein the first physical alignment feature comprises at least one alignment cavity and the third physical alignment feature comprises at least one tapered alignment protrusion.

4. The method as in claim 1 wherein the first physical alignment feature comprises at least one alignment cavity and the third physical alignment feature comprises at least one semi-spherical alignment protrusion.

5. The method as in claim 1 wherein the first physical alignment feature comprises at least one alignment cavity having at least two sides meeting to form an angle and the third physical alignment feature comprises at least one alignment protrusion having at least two sides meeting to form an angle.

6. The method as in claim 1 wherein the first physical alignment feature comprises at least one alignment protrusion and the third physical alignment feature comprises at least one alignment cavity.

7. The method as in claim 1 wherein the first physical alignment feature comprises at least one tapered alignment protrusion and the third physical alignment feature comprises at least one alignment cavity.

8. The method as in claim 1 wherein the first physical alignment feature comprises at least one semi-spherical alignment protrusion and the third physical alignment feature comprises at least one alignment cavity.

9. The method as in claim 1 wherein the first physical alignment feature comprises at least one alignment protrusion having at least two sides meeting to form an angle and the third physical alignment feature comprises at least one alignment cavity having at least two sides meeting to form an angle.

10. A method for aligning a semiconductor device comprising the steps of:
    providing a semiconductor device having a first physical alignment feature comprising a first protrusion and at least one additional protrusion;
    providing a substrate having a second physical alignment feature comprising a first cavity and at least one slot having a longitudinal axis; and
    mating the first physical alignment feature with the second physical alignment feature.

11. The method as in claim 10 wherein the first protrusion is placed at a first position on the semiconductor device, the first cavity is placed in a position corresponding to the first position, and the at least one slot is placed corresponding to the at least one additional protrusions with the longitudinal axis lying on an axis extending from the first cavity to the at least one slot.

12. The method as in claim 11 wherein the first position is a center of thermal expansion of the semiconductor device.

13. A method for aligning a semiconductor device comprising the steps of:
    providing a semiconductor device having a first physical alignment feature comprising a first cavity and at least one slot having a longitudinal axis;
    providing a substrate having a second physical alignment feature comprising a first protrusion and at least one additional protrusion; and
    mating the first physical alignment feature with the second physical alignment feature.

14. The method as in claim 13 wherein the first protrusion is placed at a first position, the first cavity is placed at a position corresponding to the first position and the at least one slot is placed corresponding to the at least one additional protrusion with the longitudinal axis lying on an axis from the first cavity to the at least one slot.

15. The method as in claim 14 wherein the first cavity is placed at a center of thermal expansion of the semiconductor device.

16. The method as in claim 1 wherein the first physical alignment feature comprises a protrusion made by etching the semiconductor device.

17. The method as in claim 1 wherein the first physical alignment feature comprises a protrusion made by plating the semiconductor device.

18. The method as in claim 1 wherein the first physical alignment feature comprises a cavity made by etching the semiconductor device.

19. The method as in claim 1 wherein the third physical alignment feature comprises a protrusion made by plating then etching the substrate.

20. The method as in claim 1 wherein the third physical alignment feature comprises a cavity made by etching the substrate.

21. The method as in claim 1 wherein the third physical alignment feature comprises a cavity made by plating then etching the substrate.

22. The method as in claim 1 wherein the semiconductor device is a semiconductor die.

23. The method as in claim 1 wherein the semiconductor device is a semiconductor wafer.

24. A method for aligning a semiconductor wafer comprising the steps of:
    providing a semiconductor wafer having at least one semiconductor die and having a first physical alignment feature located at a center of thermal expansion of each of the at least one semiconductor die and having a second physical alignment feature located away from the center of thermal expansion of each of the at least one semiconductor die;
    providing a flexible mounting substrate having a third physical alignment feature for each of the at least one semiconductor die; and
    mating the first and second physical alignment features with the third physical alignment feature.

25. The method as in claim 24 wherein the first physical alignment feature comprises at least one alignment cavity and the third physical alignment feature comprises at least one alignment protrusion.

26. The method as in claim 24 wherein the first physical alignment feature comprises at least one alignment cavity and the third physical alignment feature comprises at least one tapered alignment protrusion.

27. The method as in claim 24 wherein the first physical alignment feature comprises at least one alignment protrusion and the third physical alignment feature comprises at least one alignment cavity.

28. The method as in claim 24 wherein the first physical alignment feature comprises at least one tapered alignment protrusion and the third physical alignment feature comprises at least one alignment cavity.

29. A method for aligning a semiconductor wafer comprising the steps of:
    providing a semiconductor wafer having at least one semiconductor die and having a first physical alignment feature for each of the at least one semiconductor die, wherein each of the first physical alignment features comprises a first protrusion and at least one additional protrusion;
    providing a flexible mounting substrate having a second physical alignment feature for each of the at least one semiconductor die, wherein each of the second physical alignment features comprises a first cavity and at least one slot having a longitudinal axis; and
    mating the first physical alignment feature with the second physical alignment feature.

30. The method as in claim 29 wherein the first protrusion is placed at a first position on the semiconductor die, the first cavity is placed in a position corresponding to the first position and the at least one slot is placed corresponding to the at least one additional protrusions with the longitudinal axis lying on an axis extending from the first cavity to the at least one slot.

31. The method as in claim 24 wherein the first physical alignment feature comprises a protrusion made by etching the semiconductor die.

32. The method as in claim 24 wherein the first physical alignment feature comprises a cavity made by etching the semiconductor die.

33. A method for aligning a semiconductor device comprising the steps of:

provide a semiconductor device having a first alignment feature;

providing a substrate having a second alignment feature at a center of thermal expansion of the substrate and having a third alignment feature at a location away from the center of thermal expansion of the substrate; and coupling the substrate and the semiconductor device such that the first alignment feature mates with the second and third alignment features.

34. The method as in claim 33 wherein the semiconductor device is a semiconductor die.

35. The method as in claim 33 wherein the semiconductor device is a semiconductor wafer.

36. The method as in claim 33, wherein the second alignment feature comprises a tapered protrusion.

37. The method as in claim 33 wherein the first alignment feature comprises a cavity and the second alignment feature comprises a semispherical protrusion.

38. The method as in claim 33 wherein the first alignment feature comprises a cavity having at least two sides meeting to form an angle and the second alignment feature comprises a protrusion having at least two sides meeting to form an angle.

39. A method for aligning a semiconductor device for testing comprising the steps of:

providing a semiconductor device having a first alignment cavity and at least one slot having a longitudinal axis;

providing a test fixture having a first alignment protrusion and at least one additional alignment protrusion; and coupling the test fixture to the semiconductor device such that the first alignment cavity receives the first alignment protrusion.

40. The method as in claim 39 wherein the first alignment cavity is located at a thermal expansion center and the at least one slot is placed corresponding to the at least one additional alignment protrusion with the longitudinal axis lying on an axis extending from the thermal expansion center to the at least one slot.

41. The method as in claim 39 wherein the test fixture further comprises externally accessible test leads such that the semiconductor device can be tested when placed in the test fixture.

* * * * *